United States Patent [19]

Hulderman

[11] 4,418,430
[45] Nov. 29, 1983

[54] MILLIMETER-WAVELENGTH OVERMODE BALANCED MIXER

[75] Inventor: Garry N. Hulderman, Riverside, Calif.

[73] Assignee: General Dynamics, Pomona Division, Pomona, Calif.

[21] Appl. No.: 308,325

[22] Filed: Oct. 5, 1981

[51] Int. Cl.³ .............................................. H04B 1/26
[52] U.S. Cl. ................................... 455/328; 333/110; 333/21 R
[58] Field of Search .................... 333/21 R, 110, 113, 333/126, 135; 329/161; 332/52; 455/325, 326, 328

[56] References Cited

U.S. PATENT DOCUMENTS

| | | |
|---|---|---|
| 2,550,409 | 4/1951 | Fernsler . |
| 2,568,090 | 9/1951 | Riblet . |
| 2,605,400 | 7/1952 | McClain, Jr. . |
| 2,686,260 | 8/1954 | Arnold . |
| 2,790,073 | 4/1957 | Curtis . |
| 2,813,973 | 11/1957 | McCoy et al. . |
| 2,834,876 | 5/1958 | Pritchard et al. . |
| 3,046,497 | 7/1962 | Forrer et al. . |
| 3,263,176 | 7/1966 | Riblet . |
| 3,274,604 | 9/1966 | Lewis .......................... 333/21 R X |
| 3,963,989 | 6/1976 | Sellberg et al. ..................... 455/328 |
| 4,229,828 | 10/1980 | Baird et al. ..................... 329/161 X |

*Primary Examiner*—Paul L. Gensler
*Attorney, Agent, or Firm*—Henry M. Bissell; Edward B. Johnson

[57] ABSTRACT

Apparatus for providing intermediate frequency signals derived from microwave energy having an overmode energy distribution. A plurality of waveguide transition sections expand applied local oscillator and input signals at a fundamental energy mode into signals at a predetermined energy overmode. A directional coupler combines these signals which have differing frequencies to provide intermediate frequency signals within the coupler. An energy extraction section comprising a plurality of diodes and filters extracts the intermediate frequency signal energy from the coupler to produce the output signals of the apparatus. Also disclosed are a fundamental-mode mixer, a subharmonically-pumped mixer and a power divider designed in accordance with the overmode concepts of the present invention.

16 Claims, 4 Drawing Figures

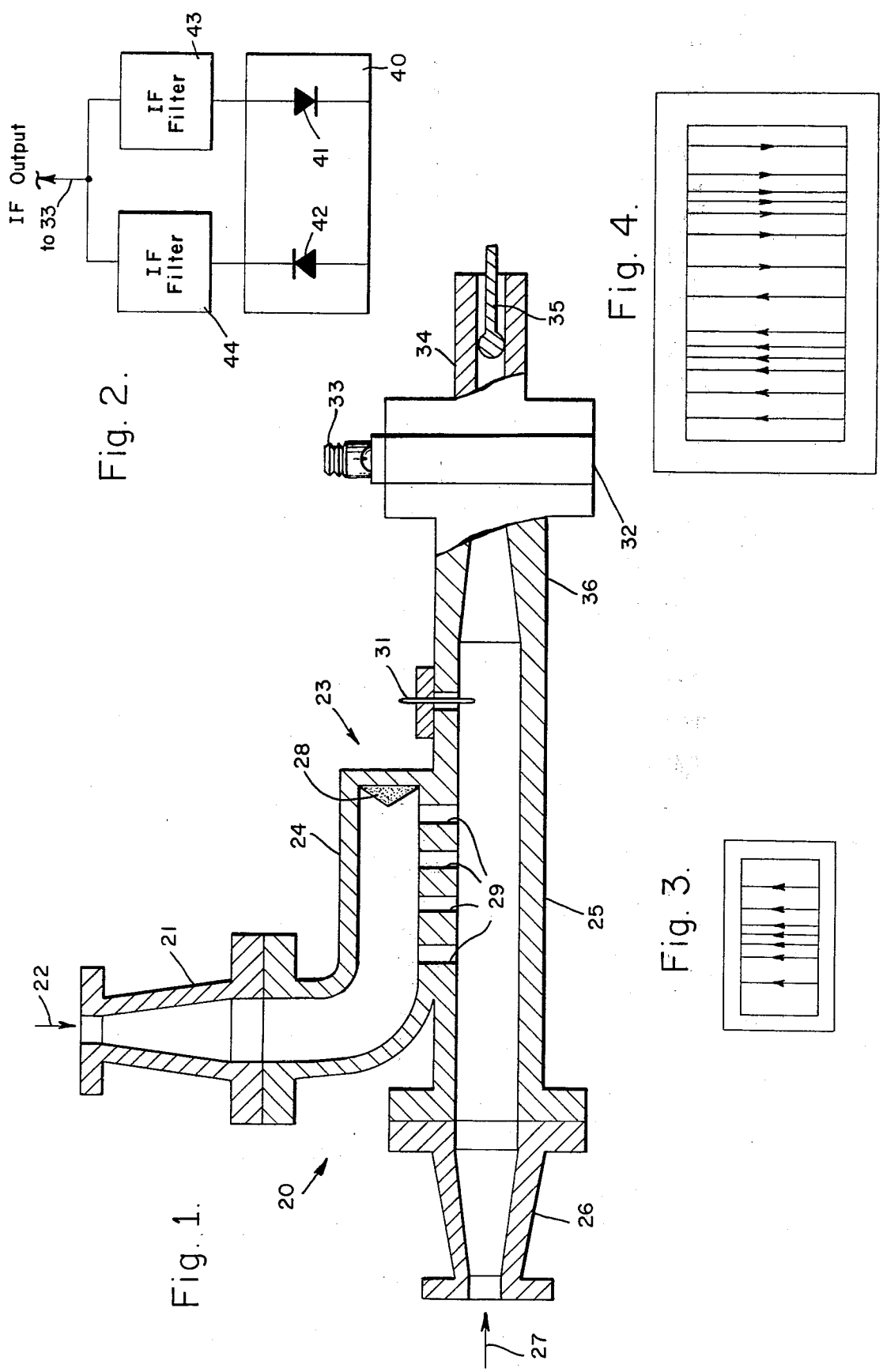

MILLIMETER-WAVELENGTH OVERMODE BALANCED MIXER

BACKGROUND OF THE INVENTION

1. Field of the Invention

The present invention relates generally to millimeter wavelength mixers and, more particularly, to millimeter wavelength mixers which provide output signals derived from higher-order energy modes of the signals applied thereto.

2. Description of the Prior Art

Balanced mixers have long been well known in the prior art relating to waveguide structures, as evidenced by the patents referenced herein. For example, Pritchard et al in U.S. Pat. No. 2,834,876 disclose a balanced mixer using a directional coupler for mixing microwave energy. The disclosed device specifically provides for control of reflected energy by strategic positioning of crystal diodes. The Curtis U.S. Pat. No. 2,790,073 discloses a balanced mixer arrangement for microwave systems employing antireciprocal circulators, such as ferrites for switching and duplexing. The Riblet U.S. Pat. No. 2,568,090 describes a balanced mixer for a radar system. The balanced mixer utilizes directional couplers and is particularly designed to develop two differently phased output voltages for direct use in push-pull application. The Fernsler U.S. Pat. No. 2,550,409 discloses a balanced mixer for controlling the phase of respective signals so that mutual cancellation of microwave energy fields within a waveguide cavity may be achieved. The Arnold U.S. Pat. No. 2,686,260 discloses structure having dual mixers within a single waveguide, and is directed to developing means for preventing cross-coupling of energy between the two mixers. The McClain, Jr. U.S. Pat. No. 2,605,400 discloses a superheterodyne receiver for radio frequencies in the range of 10 Ghz. This receiver includes a single crystal detector mounted within a waveguide coupler extending between the antenna and the first detector. McCoy et al. in U.S. Pat. No. 2,813,973 disclose a parallel waveguide structure having a single transmission line which is coupled to both waveguides for signal transfer. This structure utilizes a crystal diode for frequency conversion.

The Riblet U.S. Pat. No. 3,263,176 discloses a waveguide structure for equally dividing input microwave energy between two parallel microwave transmission paths. A cavity resonator, set at a reference frequency, is coupled in equal degree to the two transmission paths to develop wave energy with 90° phase shift in the two paths. The Forrer et al patent 3,046,497 discloses a waveguide balanced modulator for operation at 3 Ghz. A pair of crystal diodes is employed, each being coupled between a corresponding one of a pair of coaxial transmission lines and a corresponding waveguide element. However, two independent waveguide sections are utilized, and overmode mixing is not contemplated.

Current state of the art, millimeter-wavelength, balanced mixers are fabricated from sections of waveguide with inside dimensions as small as 0.034×0.017 inches at 300 Ghz. These small dimensions pose many problems in the construction of mixers, both from the standpoint of machining such small dimensions and in mounting semiconductors within those waveguide dimensions in order to extract energy from the waveguide. In addition to the mechanical problems, the loss of energy confined within these dimensions is very high. In conventional balanced mixers, the signal energy and local oscillator energy must be equally divided so that the energy may be applied to separate extraction diodes 180° out of phase with each other. This process requires a very complex and lossy structure such as a "magic T" coupler, sidewall coupler or directional coupler.

Therefore, it would be an improvement in the microwave mixing art to provide for a mixer which may be utilized at millimeter wavelengths but which has mechanical dimensions sufficient to provide for easy machining and mounting of energy extraction diodes. In addition, it would be an improvement in the mixer art to provide a mixer which has lower energy losses as compared with conventional mixers.

SUMMARY OF THE INVENTION

In order to overcome the limitations of prior art mixers, the present invention provides for an overmode mixer which generally comprises a first waveguide section for converting local oscillator energy at a predetermined frequency and fundamental mode into energy at a predetermined energy overmode. A second waveguide section is provided for converting an applied signal at a second predetermined frequency and fundamental energy mode into energy at the predetermined energy overmode. A third section is provided which couples energy from the first and second waveguide means to produce intermediate frequency (IF) signals within this section. A fourth section is coupled to the third section for coupling the intermediate frequency signal out of the third section to provide the output signal from the mixer.

More particularly, in one specific embodiment, the first and second waveguide sections comprise waveguide transition sections which expand the waveguide cross-sectional area so that the energy at the fundamental mode, $TE_{10}$, is converted to the first overmode, $TE_{20}$. The third section comprises a directional coupler to combine the energy from the first and second waveguide sections, developing an intermediate frequency (IF) signal. The fourth section comprises a plurality of diodes individually coupled to a plurality of filters which absorb the overmode energy and convert it to the mixer output.

BRIEF DESCRIPTION OF THE DRAWINGS

A better understanding of the present invention may be had from a consideration of the following detailed description, taken in conjunction with the accompanying drawings in which:

FIG. 1 is a diagram, partially broken away, illustrating a millimeter-wavelength overmode mixer constructed in accordance with the principles of the present invention;

FIG. 2 is a schematic block diagram of the energy extraction section of the mixer of FIG. 1;

FIG. 3 shows the distribution of fundamental mode energy present at the signal inputs to the mixer of FIG. 1; and FIG. 4 shows the overmode energy distribution present at the energy extraction section of the mixer of FIG. 1.

DETAILED DESCRIPTION OF THE DRAWINGS

Referring now to FIG. 1, there is shown one embodiment of a millimeter-wavelength overmode balanced mixer constructed in accordance with the principles of the present invention. The mixer 20 is comprised of a first waveguide transition section 21 which has its input end coupled to a local oscillator (not shown) which provides local oscillator signals 22 thereto. The first waveguide transition section 21 is coupled to the input of a first section 24 of a directional coupler 23, while coupling ports 29 provide the output from the first section 24 into a second section 25 of the directional coupler 23. An absorber 28 is provided within the first section 24 at the distal end of the first section 24, relative to its input.

A second waveguide transition section 26 has its output coupled to the input of the second section 25 of the directional coupler 23, and has its input coupled to a source (not shown) of input signals 27. A pair of modal purity probes 31 are provided which are disposed so as to extend partially within the second section 25 of the directional coupler 23 in line with the extraction diodes (FIG. 2). The modal purity probes 31 are utilized to minimize distortion of energy fields within the directional coupler 23 and tend to stabilize the microwave energy in the selected overmode.

The output of the directional coupler 23 is coupled to a diode support structure 32 which comprises a plurality of diodes and filter networks that are utilized to extract power from the directional coupler 23. An RF output coupler 33 is provided which allows for external utilization devices to be coupled to the overmode mixer 20. A backshort support structure 34 of conventional design is coupled to the aft end of the diode support structure and includes a backshort plunger 35 which is utilized to adjust the phase of energy reflected onto the diodes within the diode support structure 32.

The various structural components of the overmode mixer 20 may be comprised of any suitable metal, or the like, which is commonly used to transmit microwave energy. The couplings between the various components may be accomplished by the use of flanges or the like secured by bolts or equivalent. The absorber 28 may be any suitable power absorbing substance, such as ferrite or the like. The modal purity probes 31 are preferbly comprised of ferrite or brass, and are disposed within the directional coupler 23 in a conventional manner in order to accomplish the desired energy distortion minimization. Their position can be adjusted slightly, toward or away from the diodes 41, 42, as can the depth of penetration into the waveguide for optimum stability.

In operation, the overmode mixer 20 couples local oscillator power at a fundamental mode ($TE_{10}$) into the input section of the first transition section 21. The first transition section 21 converts this fundamental energy mode signal into the first overmode ($TE_{20}$) which is coupled into the first section 24 of the directional coupler 23. Simultaneously, the input signal 27 which is to be mixed with the local oscillator energy signal 22 is coupled to the input section of the second waveguide transition section 26. The transition sections 21, 26 are tapered both as to height and width in order to develop the desired overmodes of the input signals. The input signal 27 is originally at the fundamental mode and the second waveguide transition section 26 converts this energy into the first overmode as did the first waveguide transition section 21. The first overmode input signals and the first overmode local oscillator signals are combined in the directional coupler 23. A transition portion 36 is tapered in the height dimension only, thus permitting the overmode energy distribution to exist in the diode section 32. The frequencies of the two signals are slightly different, and hence a beat frequency signal is generated within the directional coupler 23 which is at an intermediate frequency (IF). The energy within the directional coupler 23 is extracted by the diodes within the diode support structure and the IF signal is selected by the filters 43, 44 and combined to provide the final output signal from the overmode mixer 20. In order to obtain maximum energy at the diodes within the diode support structure 32, the backshort plunger is adjusted appropriately.

In order to more fully appreciate and understand the present invention, reference is made to the block diagram FIG. 2, which shows the internal components of the diode support structure 32. FIG. 2 corresponds to a sectional view of the portion 32, taken at right angles to the view of FIG. 1. Shown in FIG. 2 is the wall of a waveguide 40 which has first and second diodes 41, 42 disposed between the upper and lower surfaces of the waveguide 40. The output from each diode 41, 42 is individually coupled through first and second IF filters 43, 44, whose outputs are combined to provide the output signal of the overmode mixer 20, which is in turn coupled to the RF output coupler 33. The relative position and polarity of the diodes 41, 42 are relatively important to the operation of the present invention, and a better understanding of their positioning within the waveguide may be derived with reference to FIGS. 3 and 4.

FIG. 3 shows the energy distribution of the input signal 27 at the input of the first transition section 26. As can be seen from FIG. 3, the fundamental mode has the energy flux density peaking at or near the center of the waveguide section and this energy is of one polarity. The energy input signal 22 from the local oscillator applied to the first waveguide transition section 21 has substantially the same energy distribution.

Referring to FIG. 4, there is shown the energy distribution at the output of the second waveguide transition section 26 in terms of the energy distribution of the transmitted input signal 27. As may be seen from FIG. 4, the energy distribution across the waveguide section has two peaks corresponding to the first overmode, and it can be seen that the energy has a positive polarity on the left side of the waveguide while having a negative polarity on the right side thereof.

The intermediate frequency signals generated within the directional coupler 23 have the same energy distribution as shown in FIG. 4. The diodes 41, 42 are disposed within the diode support structure 32 at positions which allow the diodes 41, 42 to intercept the maximum amount of energy which is transmitted through the waveguide. This corresponds to those positions in FIG. 4 where the energy density is at a maximum for the two polarities.

Thus it can be seen that the present invention provides for an overmode mixer which combines an input signal with a local oscillator signal to produce a high power intermediate frequency output signal. Generally, energy losses due to transmission through the waveguide structure at the first overmode are much lower than transmission losses at the fundamental mode for upper-millimeter-wavelength frequencies. In addition, the relative size of the waveguide structure has been increased with the use of the first overmode energy distribution, and hence both machining dimensions and the diode support structure dimensions are increased so as to more easily allow for the mounting of conventional diodes, and the like.

The present invention, however, is not limited to the use of only the first overmode as shown in the illustrative embodiment of FIG. 2. By doubling the waveguide dimensions of FIG. 2 and maintaining the same frequency throughout the waveguide structure, the electrical fields would be divided into four segments, with each segment having a point of maximum energy distribution therein. Accordingly four diodes, properly biased, could extract the intermediate frequency signal from such a configuration. In fact, tests have been conducted using waveguides which are 20 times oversize which indicate that transmission losses are reduced by about 80% from conventional single-mode waveguide structures.

Additionally, the present invention is not limited to power combining, as in the mixer of FIG. 2, but may be operated as a fundamental-mode mixer, or subharmonically-pumped mixer, or as a power divider in a single waveguide. In particular, the present invention may be used as a subharmonic mixer by eliminating the first transition section 21 from the apparatus of FIG. 1 and directly coupling the fundamental mode local oscillator energy at the first subharmonic frequency into the directional coupler 23.

The overmode principles of the present invention may be utilized for power combining in a single waveguide. For example in waveguide apparatus comprising components 26, 25, 32, 33, 34, and 35 as shown in FIG. 1, and wherein the second section 25 has a solid wall instead of ported with the coupling ports 29, the desired power combining could be accomplished. The mounting of two or more power generating devices, such as Gunn or Impatt diodes, as shown in FIG. 2, within the diode support structure 32 would allow for power combining. The number of overmodes within the waveguide would determine the number of diodes utilized across the waveguide section.

The overmode principles of the present invention may also be used for power division in a single waveguide by replacing the diode support structure 32 and backshort support structure 34 with a plurality of antenna slots disposed across the broad wall of the waveguide with the dimensions of the antenna slots being large enough to transmit the required number of energy overmodes.

It is to be understood that the above-described examples are merely illustrative of some of the many specific embodiments which represent applications of the principles of the present invention. Clearly, numerous and varied other arrangements may be readily devised by those skilled in the art without departing from the spirit and scope of the invention.

What is claimed is:

1. An overmode mixer comprising:

first waveguide means for converting a first applied signal at a first predetermined fundamental frequency having a first predetermined energy mode to a first output signal having a predetermined energy overmode;

second waveguide means for converting a second applied signal at a second predetermined fundamental frequency having a second predetermined energy mode to a second output signal having said predetermined energy overmode;

the first and second fundamental frequencies differing in nominal value by a selected intermediate frequency, the energy modes of the first and second applied signals being of like fundamental mode, the energy overmodes of the first and second output signals being of like overmode;

third means coupled to said first and second means for combining the energy of said first and second output signals at said predetermined energy overmode to produce intermediate frequency signals within said third means corresponding to said selected intermediate frequency; and fourth means coupled to said third means for coupling said intermediate frequency signals out of said third means to provide an intermediate frequency output signal of said mixer.

2. The mixer of claim 1 wherein said third means comprises a directional coupler channelling the first and second output signals in the same direction within the third means.

3. The mixer of claim 1 wherein the first and second fundamental frequencies are both in the $TE_{10}$ mode and the overmodes of both frequencies are in the $TE_{20}$ mode.

4. The mixer of claims 1 or 2 wherein said third means further comprises means for minimizing distortion in the energy fields of said first and second output signals.

5. The mixer of claims 1 or 2 wherein said fourth means comprises diode and filter means for extracting energy from said third means at said intermediate frequency and providing said intermediate frequency output signal of said mixer.

6. The mixer of claim 5 wherein said diode and filter means comprises:

a plurality of diodes positioned with respect to the energy distribution within said third means so as to maximize the absorption of energy by said diodes at said intermediate frequency; and a corresponding plurality of intermediate frequency filters for filtering said intermediate frequency signals to provide said intermediate frequency output signal of said mixer.

7. An overmode mixer comprising:

first waveguide means for converting a first applied signal at a first predetermined fundamental frequency having a $TE_{10}$ energy mode to a first output signal having a $TE_{20}$ energy overmode;

second waveguide means for converting a second applied signal at a second predetermined fundamental frequency having a $TE_{10}$ energy mode to a second output signal having said $TE_{20}$ energy overmode;

the fundamental frequencies of the first and second applied signals being slightly different from each other to develop a preselected intermediate frequency when the two signals are combined;

third means coupled to said first and second means for combining the energy of said first and second output signals at said $TE_{20}$ energy overmode to produce mixer signals within said third means at said intermediate frequency, said intermediate frequency signals having an energy distribution containing a plurality of energy peaks of alternating polarity; and fourth means coupled to said third means for coupling said intermediate frequency signals out of said third means, said coupling being accomplished by utilizing a plurality of diodes disposed within said third means at positions where said energy peaks occur, and biased so as to absorb said intermediate frequency signals to provide an intermediate frequency output signal of said mixer.

8. The method of mixing microwave energy to derive a selected output signal comprising the steps of:
applying a first microwave signal at a first predetermined fundamental frequency to a first input port of a waveguide structure;
converting the microwave energy of the first signal to a selected energy overmode;
applying a second microwave signal at a second predetermined fundamental frequency to a second input port of the waveguide structure, the first and second frequencies differing slightly by a selected intermediate frequency value;
converting the energy of said second signal to the same energy overmode as said selected overmode of the first signal;
mixing the same energy overmodes of the first and second signals to develop an energy distribution within a portion of the waveguide structure which has discrete energy density maxima of opposite polarities; and
extracting the microwave energy by means of diodes mounted across the waveguide structure in the positions of said energy density maxima to develop output signals in accordance with the derived overmode energy.

9. The method of claim 8 wherein each diode is mounted with a polarity according to the polarity of the associated energy density maximum.

10. The method of claim 8 further including the step of coupling a plurality of filters individually in series with the diodes and tuned to the intermediate frequency developed from the mixing of the like overmode energy.

11. The method of claim 10 further comprising the step of combining the signals from the outputs of the filters to develop a single IF frequency output signal.

12. A balanced mixer waveguide structure for mixing microwave signals of millimeter wavelength comprising:
a first port for receiving millimeter wavelength signals from an RF source at a first fundamental frequency;
a first transition section including a portion of expanded dimensions relative to the first port for converting received millimeter wavelength signals to a first overmode form;
a second port for receiving millimeter waveguide signals from a local oscillator at a second fundamental frequency differing slightly from said first frequency for mixing with the first signals to develop a selected intermediate frequency;
a second transition section including a portion of expanded dimensions relative to the second port for converting the second frequency signals to said first overmode form;
a mixer section of expanded dimensions positioned to receive said first overmode energy corresponding to the first and second signals for mixing said first overmode energy to develop corresponding intermediate frequency signals having an energy distribution within the mixer portion exhibiting a plurality of energy density maxima; and
means for extracting energy from the energy density maxima positions to develop an intermediate frequency output signal.

13. The device of claim 12 further including a backshort structure connected adjacent the extracting means and including an adjustable backshort member for establshing an appropriate reflected energy phase for the extracting means.

14. The device of claim 12 wherein each energy density maximum is of opposite polarity, relative to an adjacent maximum, and wherein the extracting means comprise a plurality of diodes, one positioned at each energy density maximum and aligned in accordance with the polarity of the energy at that diode position.

15. The device of claim 14 further including a plurality of IF filters connected respectively in series with the diodes for filtering the intermediate frequency energy from the associated diodes.

16. The device of claim 15 further including means for connecting the intermediate frequency filters together to develop a common intermediate frequency output signal.

* * * * *